United States Patent [19]

Ibuchi

[11] Patent Number: 4,951,085
[45] Date of Patent: Aug. 21, 1990

[54] IMAGE FORMING APPARATUS
[75] Inventor: Yoshiaki Ibuchi, Nara, Japan
[73] Assignee: Sharp Kabushiki Kaisha, Osaka, Japan
[21] Appl. No.: 378,999
[22] Filed: Jul. 12, 1989
[30] Foreign Application Priority Data Jul. 20, 1988 [JP]  Japan ................................ 63-181195

[51] Int. Cl.⁵ .............................................. G03B 27/80
[52] U.S. Cl. ......................................... 355/38; 355/68
[58] Field of Search ........................ 355/38, 41, 34, 35, 355/32, 33, 36, 68; 354/21

[56] References Cited

U.S. PATENT DOCUMENTS 4,437,742  3/1984  Taniguchi .............................. 354/21
4,782,365  11/1988  Takagi .................................... 355/38
4,843,431  6/1989  Horiguchi et al. .................... 355/38

Primary Examiner—Michael L. Gellner
Assistant Examiner—Khanh Dang
Attorney, Agent, or Firm—Irell & Manella

[57] ABSTRACT

An image forming apparatus with a media cartridge that accommodates a roll of a light receiving sheet, a leader sheet for automatic loading being connected to the leading edge of said light receiving sheet, wherein said apparatus comprises: sensitivity information recording means, provided on the leader sheet, for recording information relating to the sensitivity of the light receiving sheet for the formation of a full color image; a sensitivity information sensor to read the sensitivity information recorded on the sensitivity information recording means; and a color correcting means for correcting colors according to the sensitivity information read by the sensitivity information sensor.

5 Claims, 8 Drawing Sheets

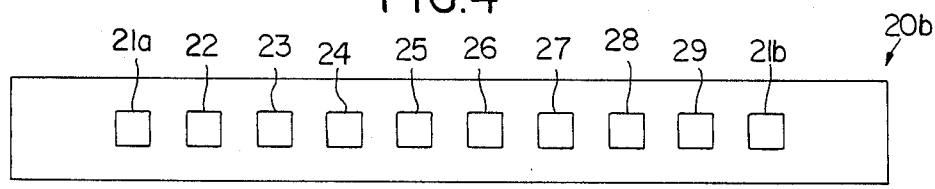
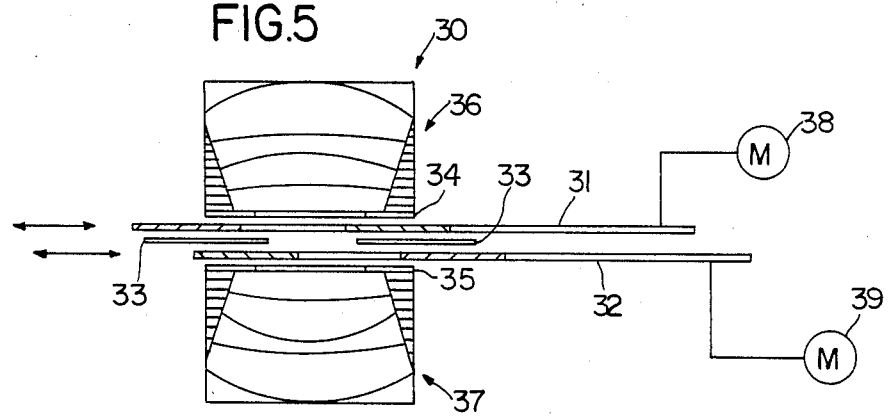
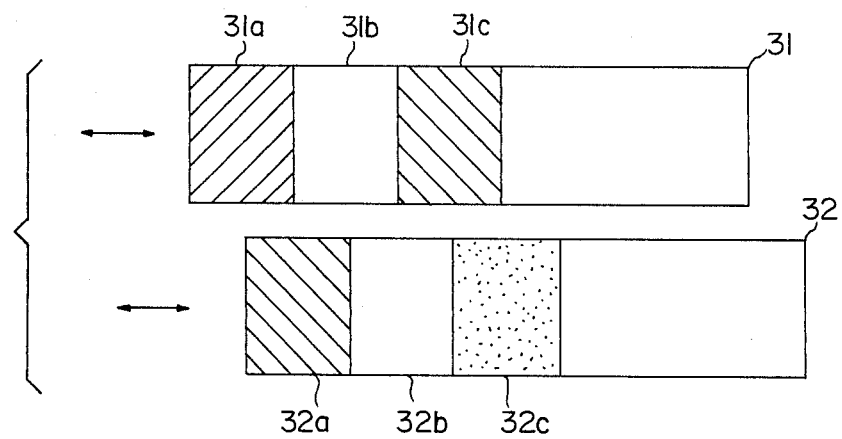

IMAGE FORMING APPARATUS

BACKGROUND OF THE INVENTION

1. Field of the Invention

The present invention relates to an image forming apparatus having a media cartridge for forming an image, wherein color corrections are made for forming a full color image according to the sensitivity of a light receiving sheet accommodated in the media cartridge.

2. Description of the Prior Art

Japanese Laid-Open Patent Publication No. 5888739 discloses an image forming method using a light receiving sheet coated with microcapsules enclosing photopolymerizable materials and image forming materials and an image receiving sheet coated with developer that reacts with the image forming materials to produce colors.

The forming of an image according to the above method proceeds as follows: when the light of an original image is projected onto the light receiving sheet, the microcapsules harden where the light strikes, resulting in a selectively hardened image. Then, the image receiving sheet coated with developer is placed over the light receiving sheet on which the selectively hardened image is formed, and pressure is applied. Application of pressure causes non-hardened microcapsules to rupture and therefore, the image forming materials enclosed therein to flow out to react with the developer on the image receiving sheet, thus producing colors and developing the image in a simple process.

To prevent the microcapsules from rupturing by an external force or being exposed to external light before the exposure process, the light receiving sheet is accommodated in a cartridge. Generally, the cartridge is in the form of a roll and with a loading leader sheet connected to the leading edge thereof, the cartridge being set in the image forming apparatus in a detachable way.

A light receiving sheet used in a pressure-and photo-sensitive image forming method such as described above is coated with a single kind of microcapsule for monochrome image forming, and coated with three kinds of microcapsules for full color image forming, i.e., microcapsules of yellow, cyan, and magenta.

As described, the light receiving sheet corresponds to a photoconductor in a conventional image forming apparatus. The sensitivity of the light receiving sheet is a vital factor determining the copy quality. Specifically, in the case of a light receiving sheet for full color image forming, the individual sensitivities of the above-mentioned three kinds of microcapsules, yellow, cyan, and magenta, as well as the whole sensitivity, become the major points to be considered.

However, it is extremely difficult to produce light receiving sheets having exactly the same sensitivity because of differences in their manufacturing and environmental conditions. For example, light receiving sheets coated with three kinds of microcapsules must be made so as to have the same characteristics with respect to the whole sensitivity as well as the individual sensitivities of these three kinds of microcapsules. Variation in sensitivity characteristics between production lots is therefore unavoidable.

Variation in sensitivity characteristics between production lots means that each time a new cartridge is loaded in an image forming apparatus, the operator must make adjustments of copy quality according to the unknown sensitivity characteristics inherent in that particular cartridge. To make the adjustments, the operator must make a number of test copies, changing the amount of exposure and color correction filters for each image forming, which requires manual operation to set proper values. Thus, the prior art has had the difficulty in adjusting the color density, color corrections, etc., particularly in full color image forming, imposing manual difficulties on the operator. The prior art has also had the difficulty of requiring a lot of time and a number of image forming operations because of manual adjusting work, wasting time and copy cost and requiring skilled work that anyone cannot do with ease.

SUMMARY OF THE INVENTION

The image forming apparatus of this invention, which overcomes the above-discussed and numerous other disadvantages and deficiencies of the prior art, is an apparatus with a media cartridge that accommodates a roll of a light receiving sheet, a leader sheet for automatic loading being connected to to the leading edge of said light receiving sheet, wherein said apparatus comprises: sensitivity information recording means, provided on the leader sheet, for recording information relating to the sensitivity of the light receiving sheet for the formation of a full color image; a sensitivity information sensor to read the sensitivity information recorded on the sensitivity information recording means; and a color correcting means for correcting colors according to the sensitivity information read by the sensitivity information sensor.

In a preferred embodiment, the leader sheet is made of a shading material.

In a preferred embodiment, the sensitivity information is given by punched holes or light transmitting holes that are formed in said leader sheet, said holes indicating the sensitivity values that are specific to said light receiving sheet.

In a preferred embodiment, the sensitivity information sensor is composed of a light emitting element and a light detecting element.

In a preferred embodiment, the color correcting means comprises first and second color correction filters that are movably disposed along a light path in a parallel manner to face each other, a movable diaphram that is disposed between said two color correction filters, fixed diaphrams that are disposed respectively outside of said color correction filters, and stepping motor means that are connected to said color correction filters so that said color correction filters are independently moved in the longitudinal direction, said first color filter being provided with a red light-absorbing filter on one edge, a colorless, transparent portion in the middle, and a green light-absorbing filter on the other edge, and said second color correction filter being provided with a green light-absorbing filter in one edge, a colorless, transparent portion in the middle, and a blue light-absorbing filter on the other edge, wherein by controlling said stepping motor means to move said two color correction filters, the insertion amount of these red, green and blue light-absorbing filters into said light path is changed to thereby carry out stepless color corrections.

Thus, the invention described herein makes possible the objectives of (1) providing an image forming apparatus that automatically makes color corrections, when a fresh media cartridge is set, by detecting the sensitivity of the light receiving sheet accommodated in the cartridge before entering the copy ready state; and (2) providing an image forming apparatus that detects the sensitivity information of microcapsules, which varies from lot to lot of light receiving sheet production, after the media cartridge is loaded and before automatic loading is completed and the ready state is entered, and makes color corrections on the basis of the thus detected information, and therefore, because the operator does not have to make test copies for adjustment of copy quality, it is possible to cut down on time and cost, while obtaining copy image of good quality.

BRIEF DESCRIPTION OF THE DRAWINGS

This invention may be better understood and its numerous objects and advantages will become apparent to those skilled in the art by reference to the accompanying drawings as follows:

FIG. 4 is a plan view of the light receiving sensor of the sensitivity information sensor provided in the image forming apparatus.

FIG. 5 is a cross sectional view of the lens section of the image forming apparatus.

FIG. 6 is plans views of the color correction filters built into the lens section.

DESCRIPTION OF THE PREFERRED EMBODIMENTS

The present invention provides an image forming apparatus in which, when a fresh media cartridge is loaded with a leader sheet, a sensitivity information sensor in the apparatus reads sensitivity information that has been pre-recorded on the sensitivity information recording means of the leader sheet, and color corrections are made by recognizing the difference from the standard sensitivity and control of the color filters, etc.

Examples

Figure 10:
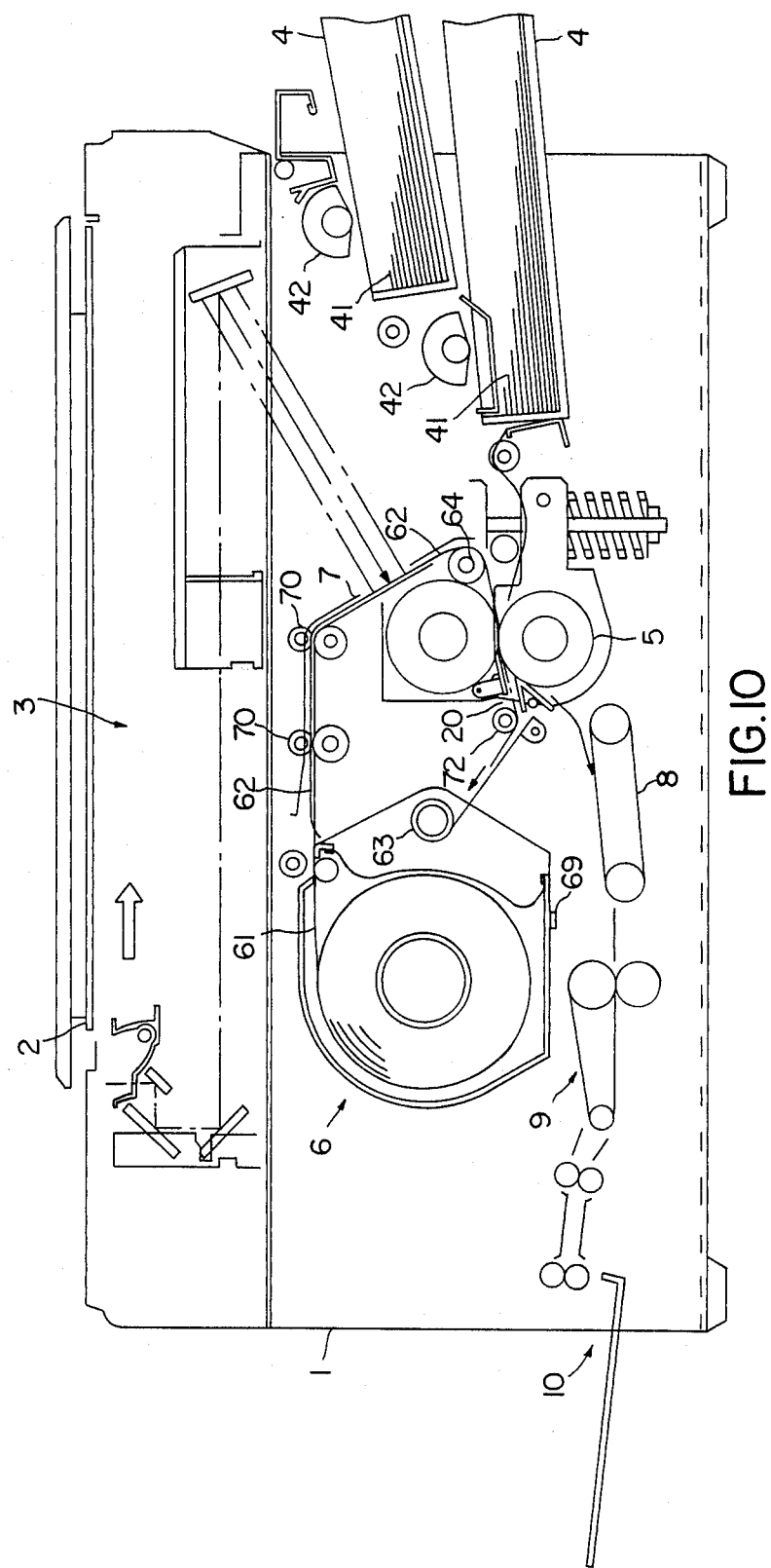
FIG. 10 is a front view of the image forming apparatus.

FIG. 10 shows an image forming apparatus of the present invention.

On the top surface of an apparatus 1 is mounted an original table 2, beneath which is disposed an optical system 3 comprising a light source, four reflecting mirrors and a lens. The optical system 3 moves in the direction indicated by the arrow in FIG. 10 to scan the original. In the right side panel of the apparatus 1 are loaded two paper cassettes 4. The paper cassettes 4 hold cut-form paper of different sizes. Two paper feed rollers 42, each disposed above the forward portion of each paper cassette 4, feed an image receiving sheet 41 one by one from whichever paper cassettes 4 has been selected.

In the middle part of the apparatus 1, a pair of pressure rollers 5 are disposed, the pressure rollers 5 contacting with each other by the pressure of a spring disposed thereunder. A media cartridge 6 is loaded in the slightly leftward portion of the apparatus 1. A path for transporting a light receiving sheet 61 is provided from the cartridge exit of the light receiving sheet 61 to the pressure rollers 5. In the middle part of a transport plate 7 is provided an opening where the light reflected from the original is projected. The light receiving sheet 61 is fed to the pressure rollers 5 by means of a reversing roller 64, where the light receiving sheet 61 and the image receiving sheet 41 fed from the paper cassette 4 are contacted with each other and pressed together, thus developing and transferring the image. After that, the light receiving sheet 61 is taken up via a transport roller onto a take-up roller 63 of the media cartridge. Downstream of the pressure rollers 5, a sensitivity information sensor 20 is provided to read sensitivity information of the light receiving sheet. Also, at the position where the media cartridge 6 is loaded, a media cartridge loading switch 69 is installed.

The image receiving sheet 41 is transported by means of a transport belt 8 and fed to an image glossing unit 9 disposed on the left. The image glossing unit 9 accelerates the coloring reaction on the image receiving sheet 41 and gives glossiness to the colored image, after which the image receiving sheet 41 exits to a paper exit section 10 on the left side.

Figure 1:
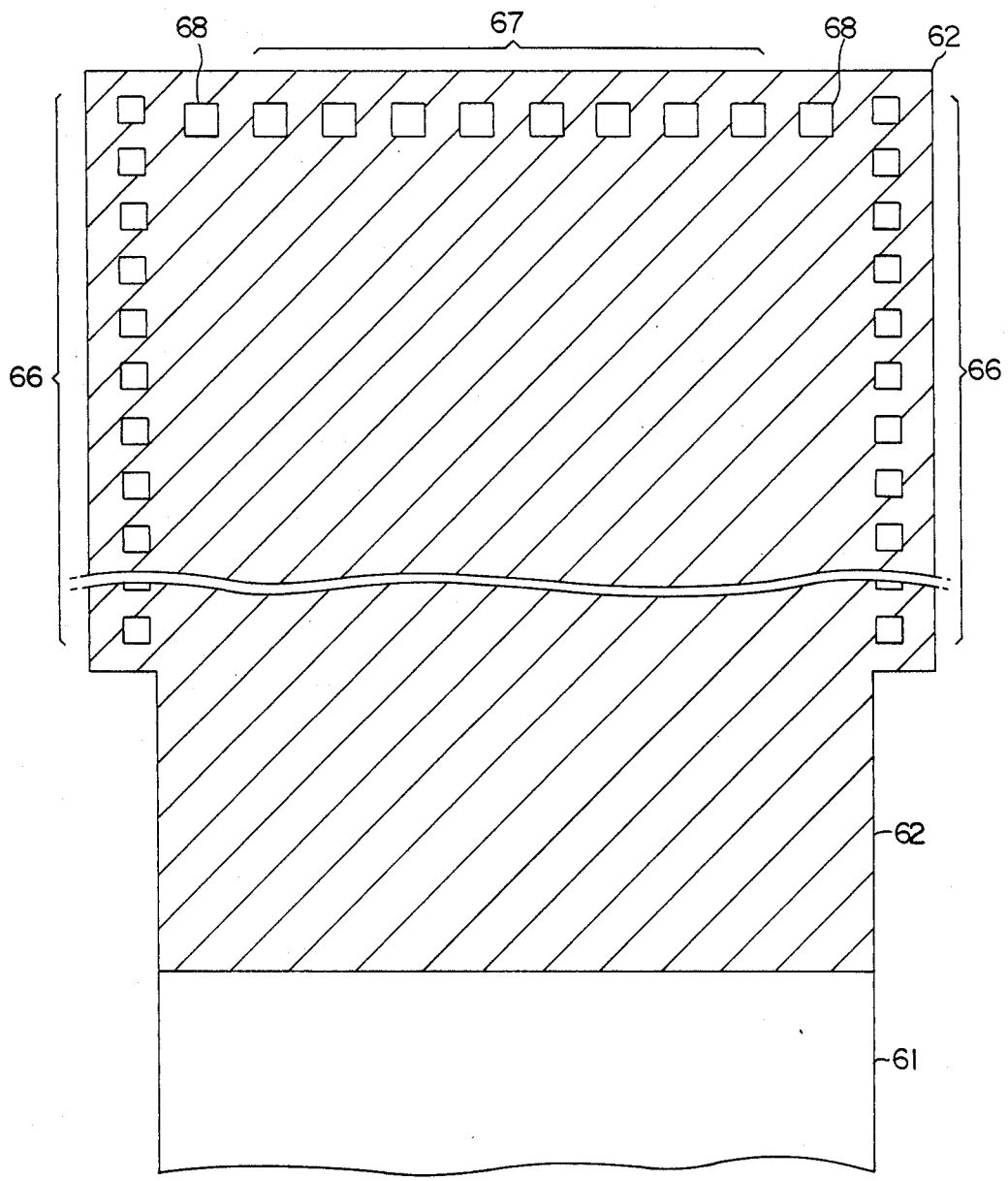
FIG. 1 is a plan view of a leader sheet connected to the leading edge of a light receiving sheet accommodated in a media cartridge to be loaded into an image forming apparatus of the invention.

FIG. 1 is a plan view of the leader sheet 62 connected to the leading edge of the light receiving sheet 61 accommodated in a media cartridge to be loaded into the image forming apparatus of the above embodiment.

The leader sheet 62 made of a stiff shading material (e.g., a polyethylene terephthalate sheet with a thickness of 100 $\mu$m) is connected to the leading edge of the light receiving sheet 61 by fusing or other methods. Also, positioning holes 66 for automatic loading are provided at both ends of the wider portion of the leader sheet 62. The leader sheet 62 covers the whole outer surface of an unused roll of light receiving sheet 61 during storage, thus preventing penetration of external light, and when the cartridge is loaded into the apparatus, the positioning holes 66 of the leader sheet 62 are engaged with positioning protrusions 65 (which is described later) on the reversing roller 64, making it ready for automatic loading.

At the extreme leading edge of the leader sheet 62 are provided punched holes 67 (that function as sensitivity information recording means in the present invention) for recording the sensitivity information of the light receiving sheet 61 as well as punched holes 68 for the reference position signal. Description of the sensitivity information recording means is given later.

Figure 2:
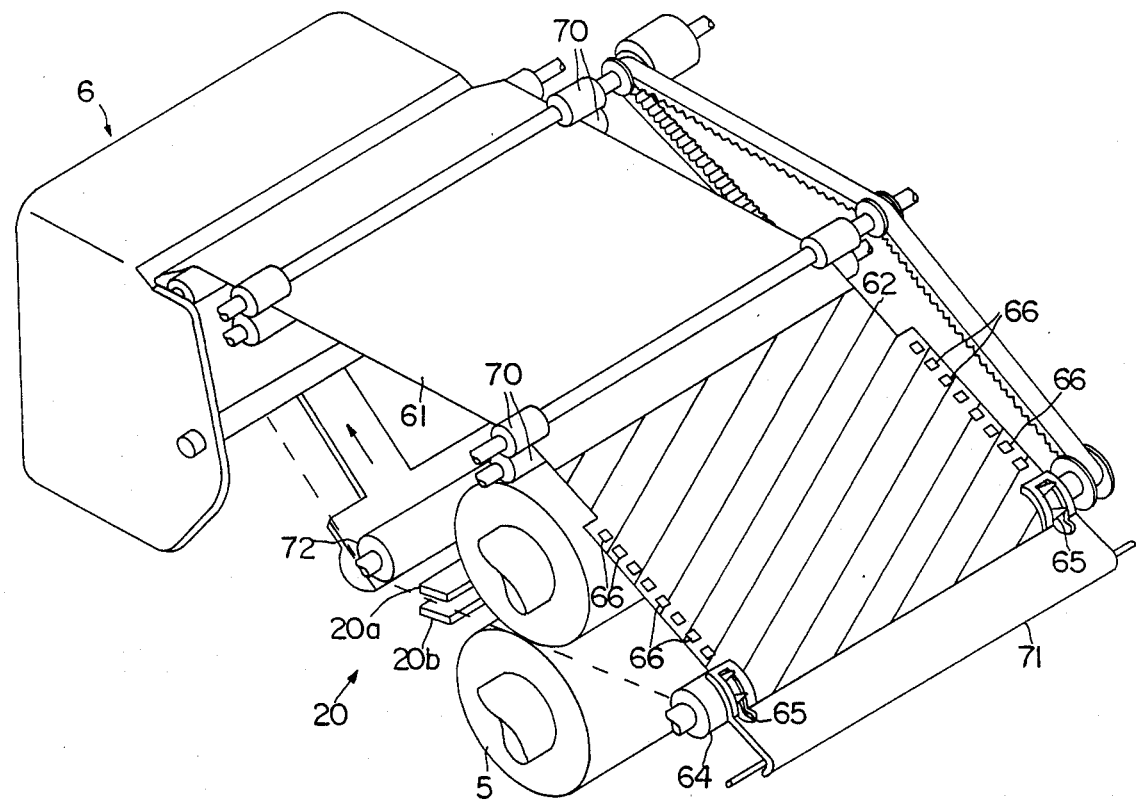
FIG. 2 is a perspective view showing the loading of the leader sheet into the apparatus.

FIG. 2 shows how the leader sheet is extracted out of the media cartridge, set in the image forming apparatus and then loaded in place.

The leader sheet 62 is automatically extracted by means of the delivery roller provided in the exit of the media cartridge 6 is passed between transport rollers 70 manually by the operator. The positioning holes 66 provided at both sides of the leader sheet are engaged with the positioning protrusions 65 on the reversing roller 64. With the engaged leading edge pressed by a sheet pressure plate 71, the leader sheet 62 is automatically fed into the pressing point on the pressure rollers 5 and then automatically taken up onto the take-up roller 63 via the transport roller 72. The sensitivity information sensor 20 interposed between the pressure rollers 5 and the transport roller 72 reads the sensitivity information of the light receiving sheet 61 as the punched holes 67 provided at the leading edge of the leader sheet passes it. The sensitivity information sensor 20 consists of a light emitting element 20a and a light detecting element 20b. The sensitivity information sensor 20 also detects the punched holes 68 for the reference position signal to check if the leader sheet has been properly set. The media sheet 61 connected to the leader sheet 62 thus loaded automatically is automatically loaded following the leader sheet.

Figures 3A, 3B:
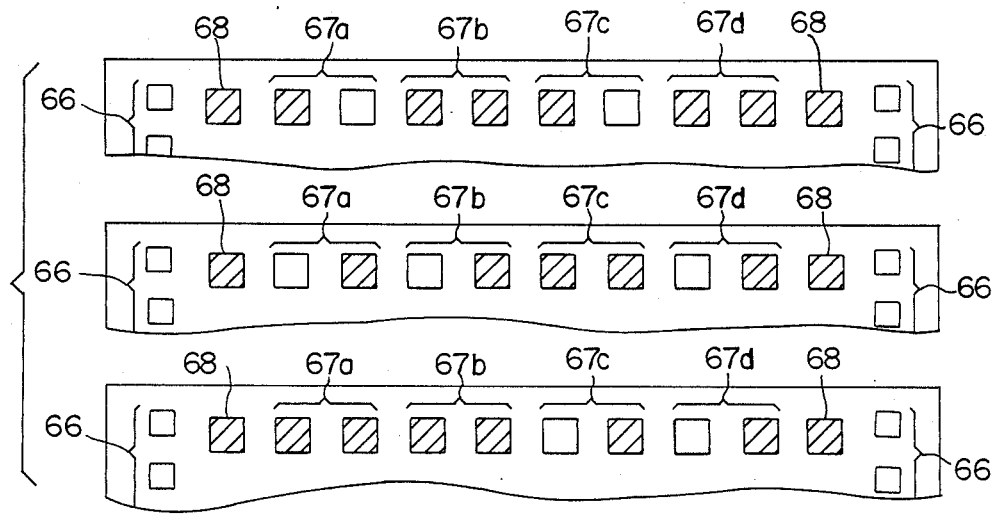
FIGS. 3A and 3B are diagrams showing recordings on a light receiving sheet sensitivity information recording means provided on the edge of the leader sheet.

FIGS. 3A and 3B show how the sensitivity information of the light receiving sheet is recorded on the sensitivity information recording means provided in the leading edge of the leader sheet.

To indicate the sensitivity of the light receiving sheet relating to full color image forming, it is necessary to determine the individual values for yellow, cyan and magenta as well as the value for the whole sheet. In this embodiment, the sensitivity values are expressed in three steps of "−1 step", "standard" and "+1 step", each being denoted as shown in FIG. 3A (black squares indicate punched holes or light transmitting holes). Actual examples according to this embodiment are shown in FIG. 3B. Inside the punched holes 68 for the reference position signal disposed at both ends of the leader sheet, the sensitivity information holes are disposed with two for each from left to right, i.e., 67a for the cyan microcapsule sensitivity, 67b for the magenta microcapsule sensitivity, 67c for the yellow microcapsule sensitivity, and 67d for the whole sensitivity. In the example at the top of FIG. 3B, the sensitivity of cyan is −1, magenta +1, yellow −1, and the whole sensitivity +1. In the example in the middle, the sensitivities are 0, 0, +1, and 0 respectively, while the example at the bottom shows the sensitivity +1, +1, 0, and 0 respectively.

Such leader sheets with pre-recorded sensitivity information of light receiving sheets are produced separately from light receiving sheets. Leader sheets are prepared for all possible sensitivity combinations, from which a leader sheet having the sensitivity information to match each particular light receiving sheet is selected for connection. Because they are connected to the light receiving sheets as finished products, leader sheets can be selectively used that match the sensitivity of each particular production lot of media cartridges, which greatly enhances convenience.

FIG. 4 is a plan view of the light detecting element 20b of the sensitivity information sensor 20 provided in the image forming apparatus. The light detecting element 20b consists of ten light detecting sensors 21a-29. The light detecting sensors 21a and 21b are for detecting the reference position of the leader sheet, and correspond with the two punched holes 68 for the reference position signal provided in the sensitivity information recording means. The light detecting sensors 22 and 23 are the sensors for the cyan microcapsule sensitivity information, 24 and 25 for the magenta microcapsule sensitivity information, 26 and 27 for the yellow microcapsule sensitivity information, and 28 and 29 for the whole microcapsule sensitivity information.

In the image forming apparatus of this embodiment, the sensitivity information sensor thus provided in the apparatus reads the sensitivity of the light receiving sheet recorded on the leader sheet of the freshly loaded media cartridge, thereby controlling the color correction filters built into the lens to perform color corrections.

FIG. 5 shows the lens section with built-in color correction filters. Along the light path and within a lens 30 composed of lens elements 36 and 37, a first color correction filter 31 and a second color correction filter 32 are movably mounted in a parallel manner to face each other. A movable diaphragm 33 is disposed between the two color correction filters, and fixed diaphragms 34 and 35 are disposed respectively outside of the color correction filters. Outwardly of them are disposed front lens elements 36 and back lens elements 37. Stepping motors 38 and 39 are connected to the first color correction filter 31 and the second color correction filter 32 respectively, the motors being controlled to move the filters in the directions shown by the arrows.

FIG. 6 shows the color correction filters. The first color correction filter 31 is provided with a cyan filter 31a (absorbs red light) on one edge, a colorless, transparent portion 31b in the middle, and a magenta filter 31c (absorbs green light) on the other edge. The second color correction filter 32 is provided with a magenta filter 32a on one edge, a colorless, transparent portion in the middle, and a yellow filter 32c (absorbs blue light). Therefore, by controlling the stepping motors 38 and 39 to move the two color correction filters, it is possible to insert no filters in the light path of the lens (no color corrections), to control the insertion amount of each of the cyan, magenta and yellow filters between 0 and 100%, and to control the combined insertion amount of two filters, i.e., cyan and magenta, cyan and yellow, and magenta and yellow, between 0 and 100%. Thus, by varying the insertion amounts of the three filters, stepless color corrections are possible.

Figure 7:
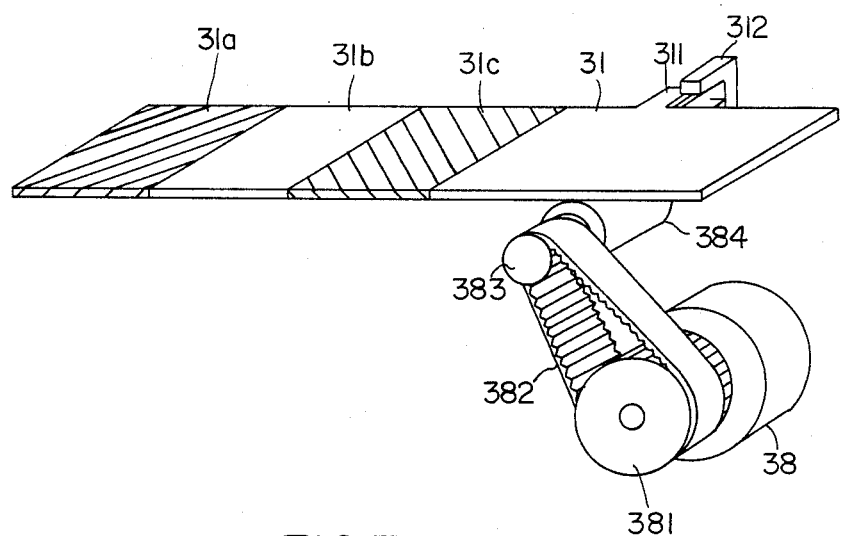
FIG. 7 is a perspective view of the color correction filter and the stepping motor connected thereto.

FIG. 7 is an external view in perspective of the first color correction filter 31 and the stepping motor 38 connected thereto. The rotation of the stepping motor 38 is transmitted to a roller 384 via a pulley 381, a belt 382, and a pulley 383 to move the filter 31 contacted on the roller 384. A detecting arm 311 is formed on the filter 31 for detecting the reference position of the filter, the reference position being detected by a detecting sensor 312. The reference position is determined so that the colorless, transparent middle portions 31b and 32b of the two filters come in the light path of the lens.

The second color correction filter is driven by the stepping motor connected thereto in the same manner as above.

Figure 9:
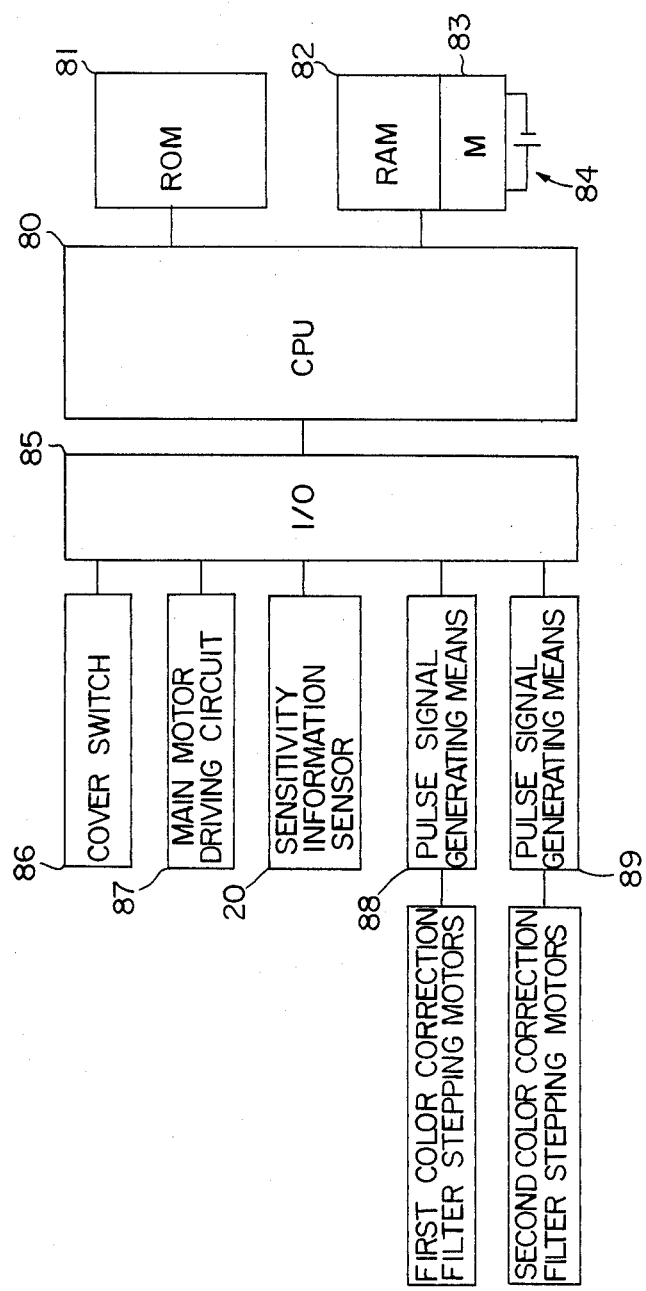
FIG. 9 is a block diagram of part of the control section of the image forming apparatus.

FIG. 9 is a block diagram of part of the control section of the image forming apparatus.

A ROM 81 and a RAM 82 are connected to a CPU 80, while the CPU 80 interfaces through an I/O 85 with a cover switch 86, a main motor driving circuit 87, the sensitivity information sensor 20, pulse signal generating means 88 for the first filter and motor, and pulse signal generating means 89 for the second filter and motor.

The CPU 80 controls the entire image forming apparatus, and the control programs are permanently contained in the ROM 81. The areas of the RAM 82 are assigned to a memory (M) 83 for storing the sensitivity information of light receiving sheet and other working areas. The memory 83 is backed up by a battery 84. When an activation signal is input from the cover switch (activated when the front cover is closed) through the I/) 85, the CPU 80 outputs signals through the I/O 85 to activate the sensitivity information sensor 20 and the main motor driving circuit. The data read by the sensitivity information sensor 20 is fed into the CPU 80 through the I/O 85 and stored in the memory 83. When the loading of a light receiving sheet is completed, the CPU 80 reads the color correction data stored in the memory 83 and outputs the signals corresponding with the data to the pulse signal generating means 88 and 89 which then output the pulses to drive the stepping motors 38 and 39 to move the color correction filters.

Figure 8:
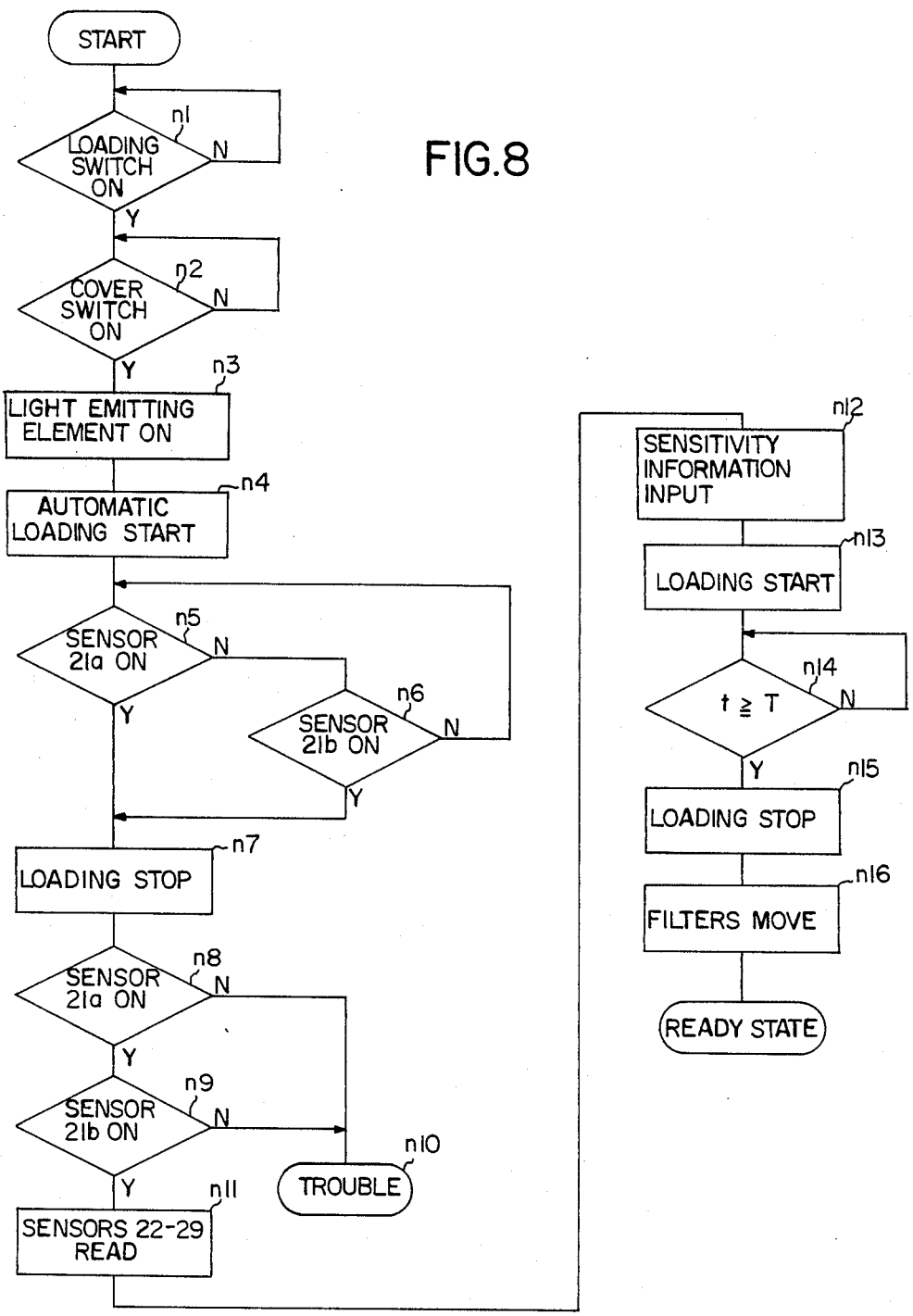
FIG. 8 is a control flowchart illustrating the operation of the apparatus for reading the sensitivity information and the color correction operation.

FIG. 8 is a flow-chart illustrating the sequence of reading of the light receiving sheet sensitivity information when the media cartridge is loaded and the control for color corrections.

When the media cartridge is loaded in place, the loading switch is activated (n1). Next, when the front cover is closed after the leader sheet is manually loaded onto the reversing roller by the operator and pressed by the pressure plate, the cover switch is activated (n2), and the light emitting element illuminates (n3) to start the automatic loading of the light receiving sheet (n4). When the light receiving sensors detect either of the reference position signals recorded on both sides of the leader sheet (n5, n6), the feeding of the light receiving sheet stops (n7), and the light receiving sensors 21a and 21b detect the punched holes for the reference position (n8, n9). If either of them cannot be detected, trouble status is issued (n10). When it is confirmed that the leader sheet has been properly loaded, the light receiving sensors 22–29 of the light receiving element read the sensitivity information (n11), which is then stored in memory (n12). The feeding of the light receiving sheet is resumed (n13), the light receiving sheet being transported for a given period of time till the leading edge of the leader sheet is taken up by the take-up roller (n14). Then, the feeding of the light receiving sheet is stopped (n15), and the color correction filters are moved to give the specified values according to the sensitivity information stored in memory (n16). After color corrections are completed, the apparatus is put in the ready state.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An image forming apparatus with a media cartridge that accommodates a roll of a light receiving sheet and that can be detached from the body of said apparatus, a leader sheet for automatic loading being connected to the leading edge of said light receiving sheet, wherein said apparatus comprises:

a detecting means for detecting the attachment of said media cartridge to the body of said apparatus;

sensitivity information recording means, provided on the leader sheet, for recording information relating to the sensitivity of the light receiving sheet for the formation of a full color image;

a sensitivity information sensor to read the sensitivity information recorded on the sensitivity information recording means;

a nonvolatile memory;

a means for delivering sensitivity data read by said sensitivity information sensor into said nonvolatile memory; and a color correcting means for correcting colors of an image to be formed, in accordance with said sensitivity data stored in said nonvolatile memory.

2. An image forming apparatus according to claim 1, wherein said leader sheet is made of a shading material.

3. An image forming apparatus according to claim 2, wherein said sensitivity information is given by punched holes or light transmitting holes that are formed in said leader sheet, said holes indicating the sensitivity values that are specific to said light receiving sheet.

4. An image forming apparatus according to claim 3, wherein said sensitivity information sensor is composed of a light emitting element and a light detecting element.

5. An image forming apparatus according to claim 3, wherein said color correcting means comprises first and second color correction filters that are movably disposed along a light path in a parallel manner to face each other, a movable diaphram that is disposed between said two color correction filters, fixed diaphrams that are disposed respectively outside of said color correction filters, and stepping motor means that are connected to said color correction filters so that said color correction filters are independently moved in the longitudinal direction, said first color filter being provided with a red light-absorbing filter on one edge, a colorless, transparent portion in the middle, and a green light-absorbing filter on the other edge, and said second color correction filter being provided with a green light-absorbing filter in one edge, a colorless, transparent portion in the middle, and a blue light-absorbing filter on the other edge, wherein by controlling said stepping motor means to move said two color correction filters, the insertion amount of these red, green and blue light-absorbing filters into said light path is changed to thereby carry out stepless color corrections.

* * * * *